United States Patent [19]
Chuang et al.

[11] Patent Number: 5,121,013
[45] Date of Patent: Jun. 9, 1992

[54] NOISE REDUCING OUTPUT BUFFER CIRCUIT WITH FEEDBACK PATH

[75] Inventors: Patrick T. Chuang; Robert L. Yau, both of Cupertino; Bill C. Tung, San Jose, all of Calif.

[73] Assignee: Advanced Micro Devices, Inc., Sunnyvale, Calif.

[21] Appl. No.: 478,608

[22] Filed: Feb. 12, 1990

[51] Int. Cl.⁵ .................. H03K 17/16; H03K 5/12
[52] U.S. Cl. .................. 307/572; 307/443; 307/542; 307/263
[58] Field of Search .......... 307/443, 475, 262, 263, 307/571, 572, 585, 542

[56] References Cited

U.S. PATENT DOCUMENTS

| | | | |
|---|---|---|---|
| 4,329,600 | 5/1982 | Stewart | 307/571 |
| 4,527,081 | 7/1985 | Stewart | 307/571 |
| 4,820,942 | 4/1989 | Chan | 307/443 |
| 4,825,101 | 4/1989 | Walters, Jr. | 307/446 |
| 4,829,199 | 5/1989 | Prater | 307/443 |
| 4,855,620 | 8/1989 | Duvvury et al. | 307/443 |
| 4,855,623 | 8/1989 | Flaherty | 307/475 |
| 4,880,997 | 11/1989 | Steele | 307/443 |
| 4,890,017 | 12/1989 | Masuda et al. | 307/443 |
| 4,894,560 | 1/1990 | Chung | 307/443 |
| 4,906,867 | 3/1990 | Petty | 307/263 |
| 4,948,991 | 8/1990 | Schucker et al. | 307/443 |
| 4,983,860 | 1/1991 | Yim et al. | 307/443 |

Primary Examiner—Stanley D. Miller
Assistant Examiner—Toan Tran
Attorney, Agent, or Firm—Skjerven, Morrill, MacPherson, Franklin and Friel

[57] ABSTRACT

Electrical buffer output circuitry includes a first high branch having a high signal input terminal, a low input branch having a low input signal input terminal, and a signal output for the buffer circuitry. Either the high branch or the low branch is turned on in response to a signal at one of the input terminals, and the resistance of the turned on branch is varied as a function of time to improve the speed and noise characteristics of the buffer until the output voltage stabilizes.

12 Claims, 7 Drawing Sheets

NOISE REDUCING OUTPUT BUFFER CIRCUIT WITH FEEDBACK PATH

BACKGROUND OF THE INVENTION

1. Field of the Invention

This invention relates in general to output buffer circuitry, and relates in particular to such circuitry having improved response speed and noise characteristics.

2. Prior Art

Figure 1:
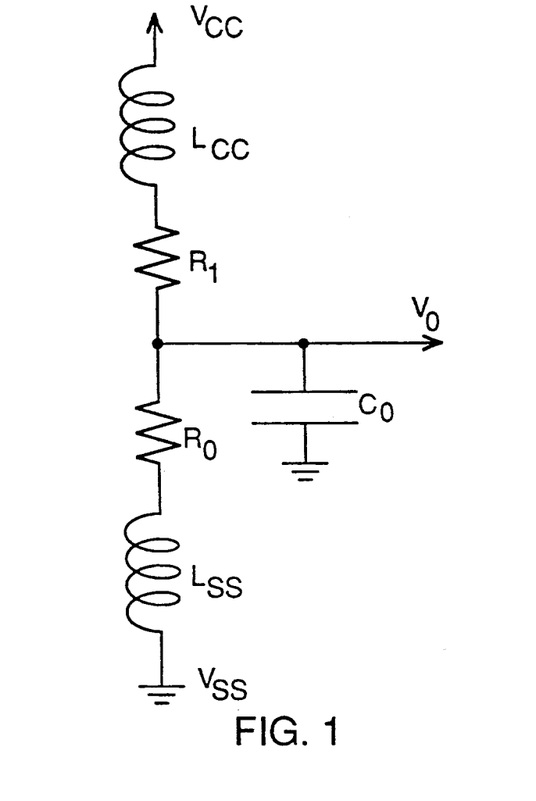
FIG. 1 is a diagram of the equivalent RLC circuit of a typical output buffer.

There are many considerations in output buffer design, such as output loading, output switching speed, inductance of the bond-wire of the package, output capacitive loading, on-resistance of the output device, and power-supply noise due to output switching. A typical output buffer can be modeled by a RLC equivalent circuit shown in FIG. 1, where:

Vcc = positive power supply; Lcc = inductance of bond wire and package in upper branch; RI = on resistance of output pull up device; Ro = on resistance of output pull down device; Lss = inductance of bond wire & package in lower branch; Vss = ground; Vo = output voltage; and Co = output capacitive loading.

Since Co, Lcc, Lss and the number of outputs Q on the power supply can not be arbitrarily changed, most prior art effort on improving output buffer design and performance has focused on one or more of the following approaches:

(1) Optimize RI and Ro for given Co, Lcc, Lss and Q values for speed and noise. In most cases, speed will suffer.

(2) Connect different input buffers to different power supplies so that output switching noise will not affect the input.

(3) If there is only one power supply, then input buffer response time must be slowed down such that it will not be false triggered by noise. (4) Equalize output to mid-level before data is available such that the output swing is always half of the maximum.

The noise involved in output buffers of the type involved here is primarily caused by feedback from the output to the input stage of the buffer. In cases where the low input to the buffer has a level of, say, 0.8 volts, this means that for any noise level of 0.8 volts or above the buffer will have difficulty in distinguishing between an input signal and noise. Similar problems can occur on the high level input to the buffer if the noise level tends to mask the signal.

The amount of noise generated is a function of the number of outputs associated with each power supply. In the ideal situation there would be one power supply for each output. However, from a practical standpoint this is not an attractive solution because of the costs and pin requirements involved.

Figure 2:
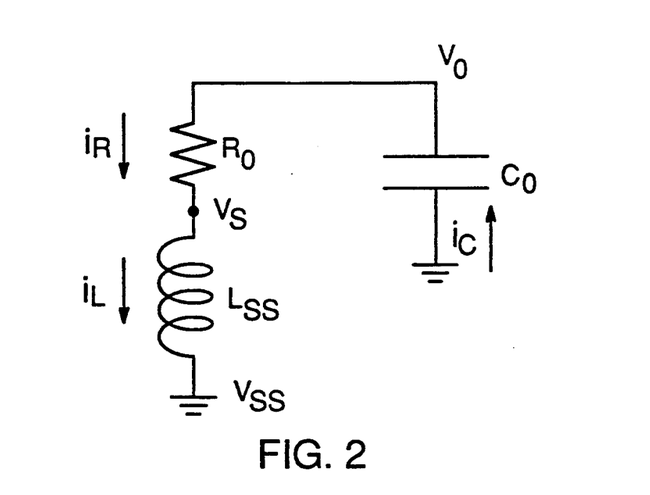
FIG. 2 is a circuit diagram of the current flow in one half of the equivalent circuit of FIG. 1.

The circuit of FIG. 1 can be analyzed as follows. Since the behaviors of the two half circuits are the same, only the half circuit including Vss needs to be considered Referring to FIG. 2, $$i_c = i_L = i_R \quad (1)$$

$$i_c = -C_o \frac{dV_o}{dt} \quad (2)$$

$$i_R = \frac{V_o - V_{s(t)}}{R_o} \quad (3)$$

$$V_{s(t)} = L_{ss} \frac{di_L}{dt} \quad (4)$$

From equations 1, 2 and 3:

$$-C_o \frac{dV_o}{dt} = \frac{V_o - V_{s(t)}}{R_o} \quad (5)$$

$$V_{s(t)} = V_o + R_o C_o \frac{dV_o}{dt}$$

From Equations 1, 3 and 4:

$$V_{s(t)} = L_{ss} \frac{d}{dt}\left(\frac{V_o - V_{s(t)}}{R_o}\right) \quad (6)$$

By dividing Equation 5 into Equation 6:

$$V_o + R_o C_o \frac{dV_o}{dt} = L_{ss} \frac{d}{dt}\left(\frac{V_o - V_{s(t)}}{R_o}\right) \quad (7)$$

$$V_o + R_o C_o \frac{dV_o}{dt} = -L_{ss} C_o \frac{d^2 V_o}{dt^2}$$

$$\frac{d^2(V_o)}{dt^2} + \frac{R_o}{L_{ss}} \frac{dV_o}{dt} + \frac{1}{L_{ss} C_o} V_o = 0$$

The solution to the above differential Equation (7) is:

$$V_o(t) = V_{cc} e^{-\frac{R_o}{2L_{ss}} t}\left[\cos\beta t - \frac{R_o}{2L_{ss}\beta}\sin\beta t\right] \quad (8)$$

$$\text{where } = \beta = \frac{1}{L_{ss}}\sqrt{\frac{L_{ss}}{C_o} - \frac{R_o^2}{4}} \quad (9)$$

To understand the effects on the circuitry of variations in the values of different component in the above equations, the values of the output voltage $V_{out(t)}$ from prior art buffers vs. time are plotted and compared in the curves of FIGS. 3a, 3b, 4a, 4b, 5a and 5b. The curves are plotted for different numbers Q of output devices ranging from 1, 4, 8 and 16 output devices.

Figure 3A:
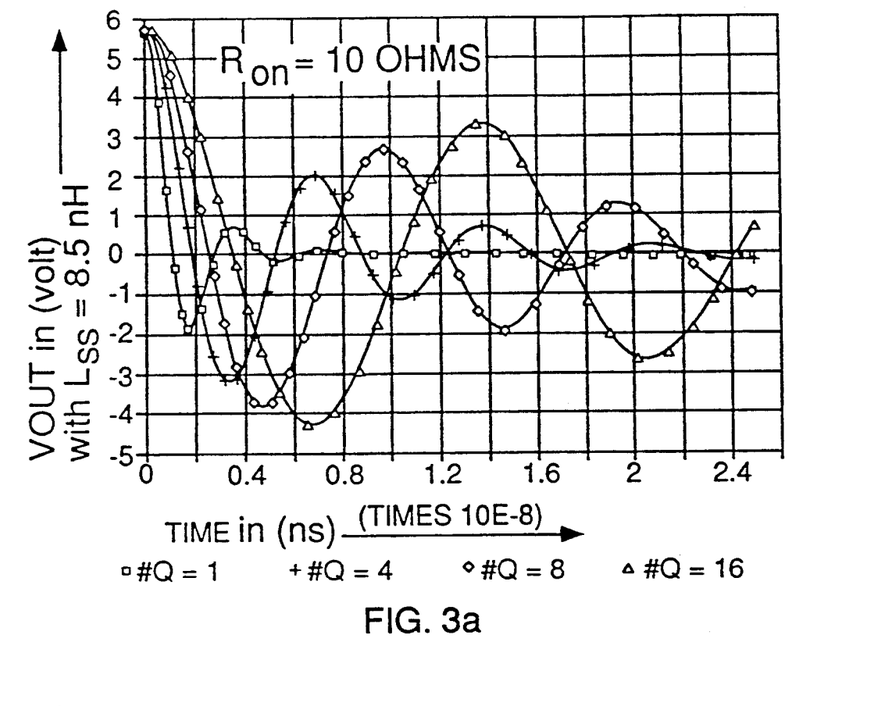
FIGS. 3a and 3b are graphs showing the effects of variations in circuit response for different values of resistance Ro and the number of outputs Q.
Figure 3B:
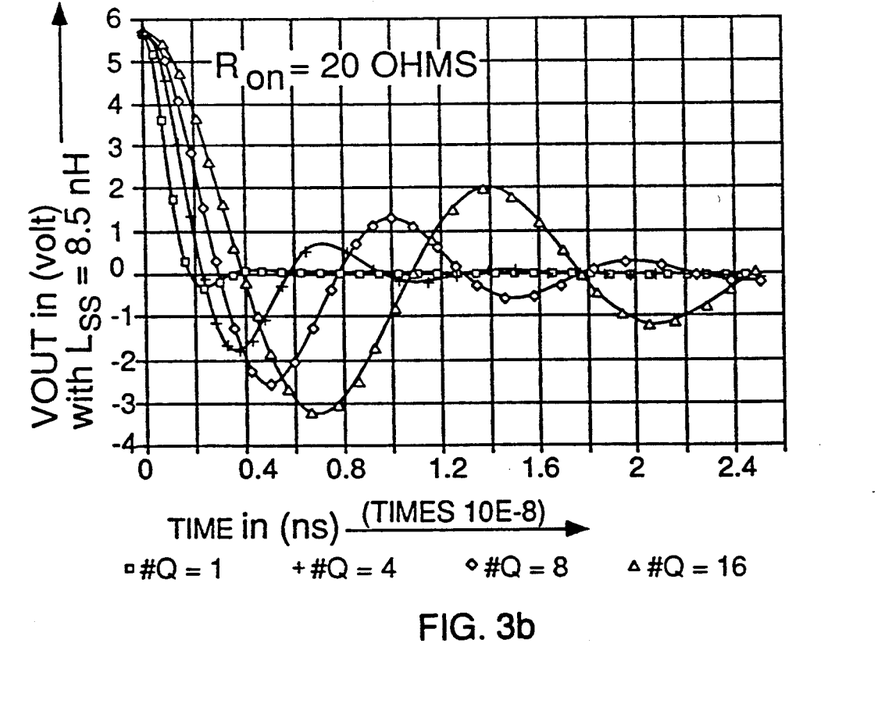

FIGS. 3a and 3b show the effects of variations in the value of Ro on the equations, with Lss = 8.5nH and Co = 35pF. Ro is plotted in two values, 10 ohms for FIG. 3a and 20 ohms for the FIG. 3b curves. The Ro = 10 ohms curves of FIG. 3a indicate that the circuitry discharged to ground level faster than shown in FIG. 3b for a 20 ohm value; however, as shown by the vertical excursions of these curves, more noise was generated. As indicated above, the number of output devices Q on a given power supply is also a major factor in determining output speed and noise; as shown in FIGS. 3a and 3b, as the number of outputs increases (Q = 1 to Q = 16), the response speed decreases and the noise increases.

Figure 4A:
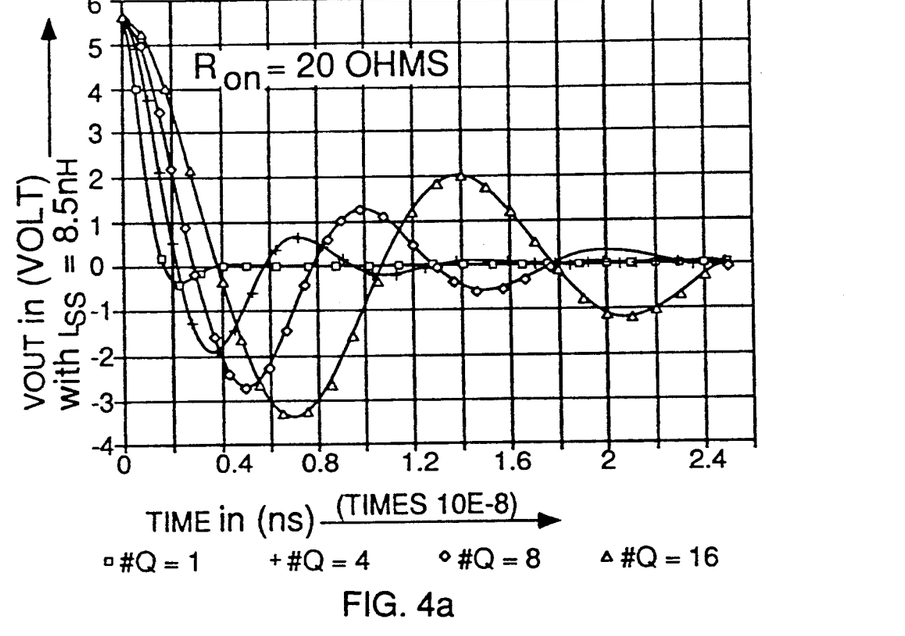
FIGS. 4a and 4b are graphs showing the effects of variations in circuit response to different values of inductance Lss and the number of outputs Q.
Figure 4B:
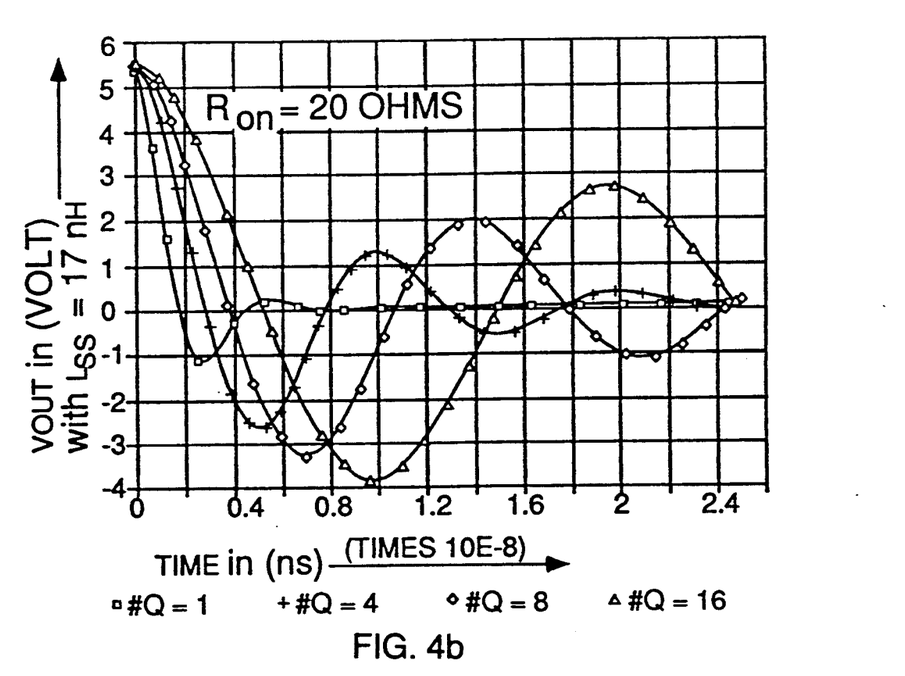

FIGS. 4a and 4b show the effects of variations of Lss on the equation, with Ro = 20 Ohms and Co = 35pF. Lss is plotted in two values, 8.5nH for FIG. 4a and 17nH for FIG. 4b. It can be seen that the 17nH curves of FIG. 4b show not only slower response time but also more noise than the 8.5.nH curves of FIG. 4a.

Figure 5A:
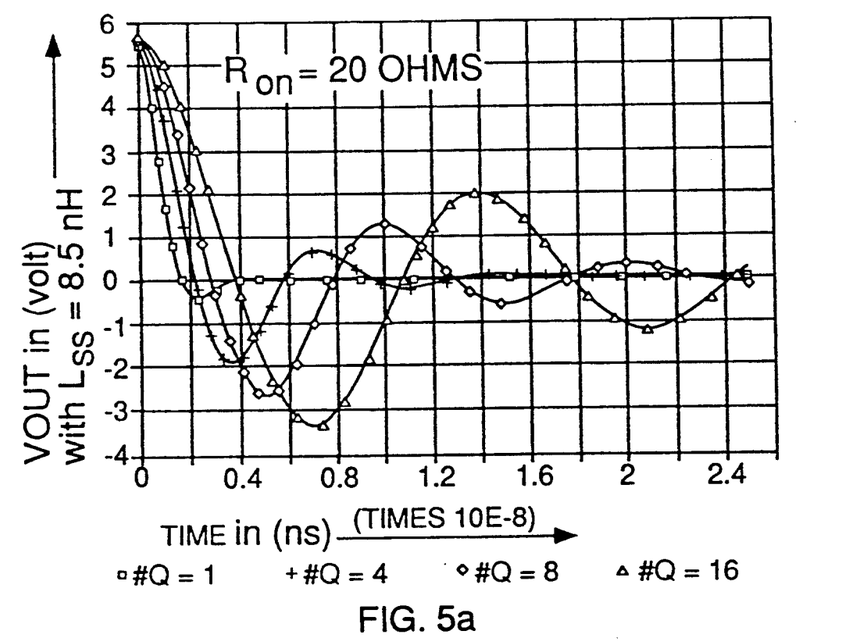
FIGS. 5a and 5b are graphs showing the effects of variations in circuit response to different values of the output loading capacitance Co and the number of outputs Q.
Figure 5B:
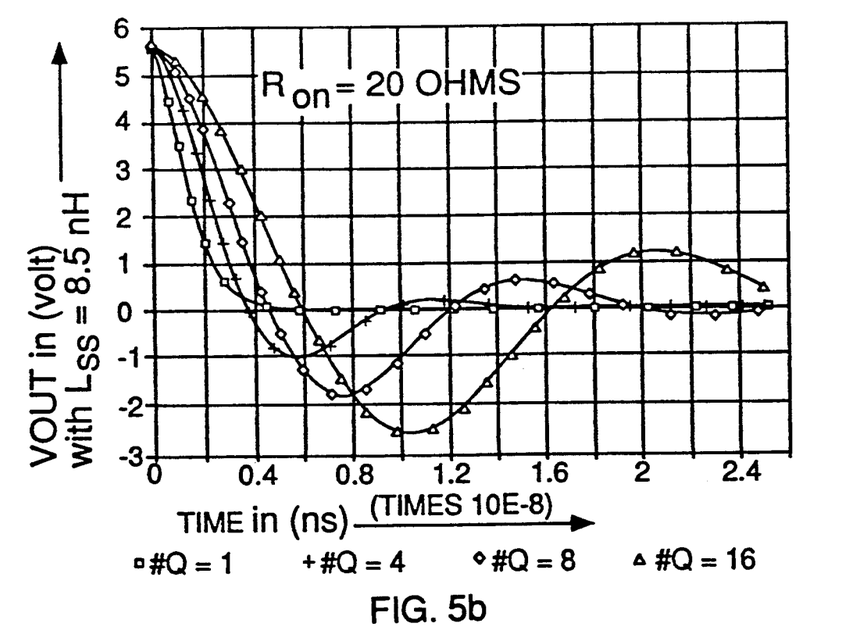

FIGS. 5a and 5b show the effects of variations in Co on the equation. With Ro=20 Ohms and Lss=8.5nH, Co is plotted in two values, 35pF for FIG. 5a and 75pF for FIG. 5b. It can be seen that the Co=75pF curves of FIG. 5b are slower but less noisy than the Co=35pF curves of FIG. 5a.

SUMMARY OF THE PRESENT INVENTION

The new output buffer described herein incorporates a variable resistance concept where R is initially maintained small to obtain maximum initial response speed, is subsequently increased during an interim period to minimize noise during the interim period, and is then reduced in value to produce a final low output voltage value.

DESCRIPTION OF THE PREFERRED EMBODIMENT

Figure 6:
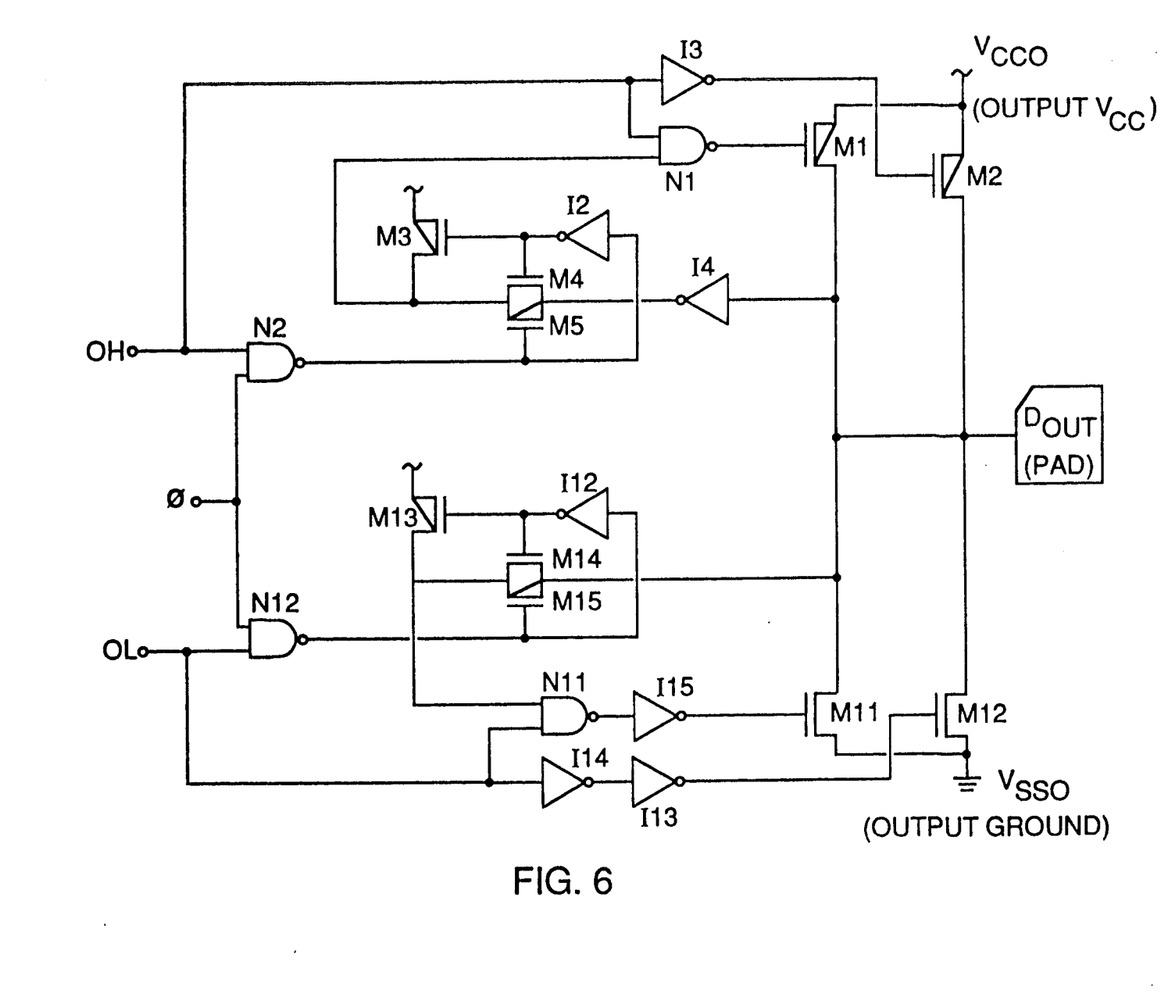
FIG. 6 is a block diagram of circuitry for implementing the present invention.

Referring to the circuitry of FIG. 6, there is shown an output buffer in accordance with the present invention having an output at Dout, a positive power supply represented by Vcco and a ground represented by Vsso. The buffer has a high input OH and a low input OL. When data is presented to the input of the output buffer, either OH (output high) or OL (output low) will change state from "0" (ground level) to "1" (Vcc). The circuitry is preferably implemented in CMOS in which either the upper branch or the lower branch of the circuitry is active. That is, either the upper branch, including inverters I2, I3 and I4, pass-gates M4 and M5, transistor M3, NAND gate N1 and pull-up P channel transistors M1 and M2 are active during buffer operation, or the lower branch of the buffer including inverters I12, I13 and I14, pass-gates M14 and M15, transistor M13, NAND gate N11 and pull-down N channel transistors M11 and M12 are active. The circuitry includes a clock represented by $\phi$ supplying an input to NAND gates N2 and N12.

Assume in the illustrated case that OL is changing to a "1" while OH remains a "0". With OH at "0" both M1 and M2 are turned off. With OL at "1", both transistors M11 and M12 are initially turned on and the output Dout discharges to ground through Vsso. At this time, Ro is small. With OL at "1", and clock $\phi$ at "1" during interval $t_2$ (FIG. 7), the pass-gates M14 and M15 are also turned on and allow the output level to feed back to NAND gate N11 whose output drives the input to transistor M11 low through inverter I15 If this output level fed back to M11 is low, then M11 will be turned off and thus the resistance of the output buffer will increase. This increase in R occurs during an interim phase or stage of the operation, thereby reducing the generated noise during the interim stage.

Figure 7:
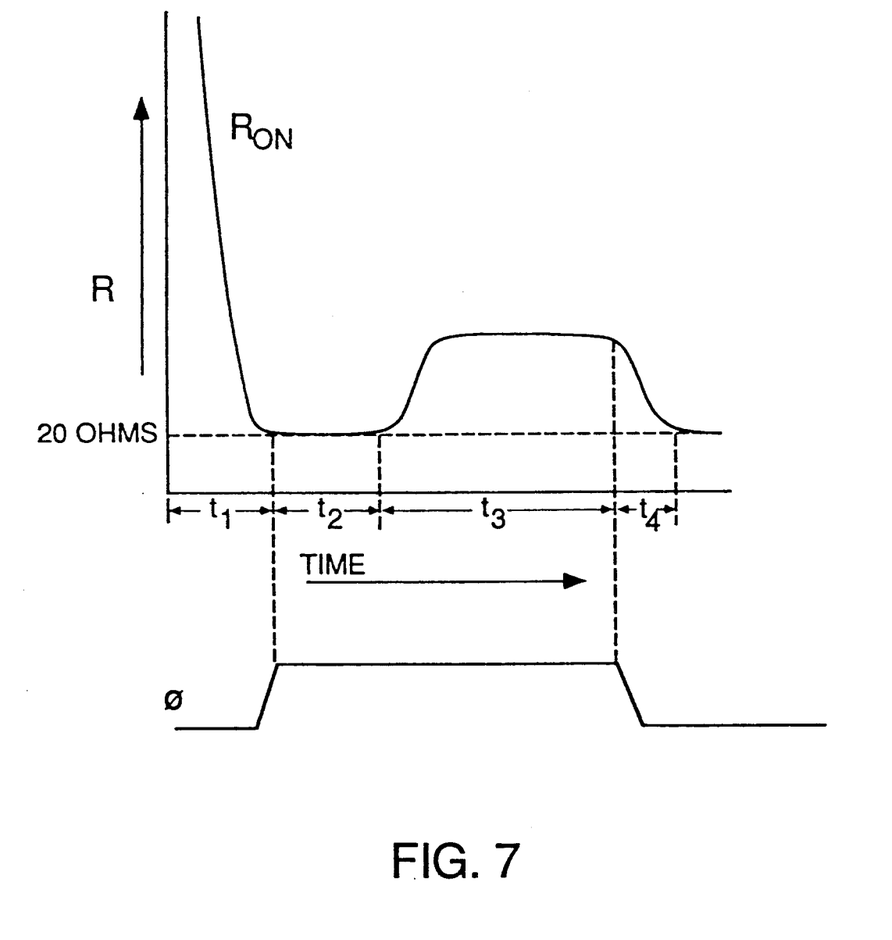
FIG. 7 is a graph illustrating the operation of the present invention in varying the effective resistance of the circuitry during different stages of its operation.

At some point during this interim period, the resistance R will begin to decrease because of the action of the feedback. This decrease will continue until it reaches the relatively low value representing its low stable output value.

The operation of the circuitry of this invention is illustrated in FIG. 7 which shows a plot of resistance R as a function of time. When the circuitry is turned on, the resistance has a high initial value, which decreases rapidly during time period $t_1$ toward the "on" resistance of M11 and M12. During period $t_1$, clock $\phi$ is off and there is no feedback to transistor M11. This is in contrast to the prior art circuitry in which the resistance is decreased relatively gradually in an effort to decrease noise.

The resistance remains at this relatively low value for a period $t_2$ while both M11 and M12 are on, thereby increasing the speed of response of the circuitry during this period. After clock $\phi$ goes to "1", feedback begins and the resistance begins to increase during the interim period $t_3$ because of the turning off of M11 as a result of the feedback discussed above. The resistance rises to a maximum value during period $t_3$ and then levels off during this period. This relatively high resistance during this interim period results in a significant reduction in noise.

The resistance begins to decrease at the end of period $t_3$ because of the clock $\phi$ returning to "0" and turning off the feedback, the resistance dropping to a relatively low value during period $t_4$ representing its final low output level. In a typical embodiment of the invention, the peak value of R during period $t_3$ may be 80 ohms, while the final value at time $t_4$ is approximately 20 ohms.

Figure 8:
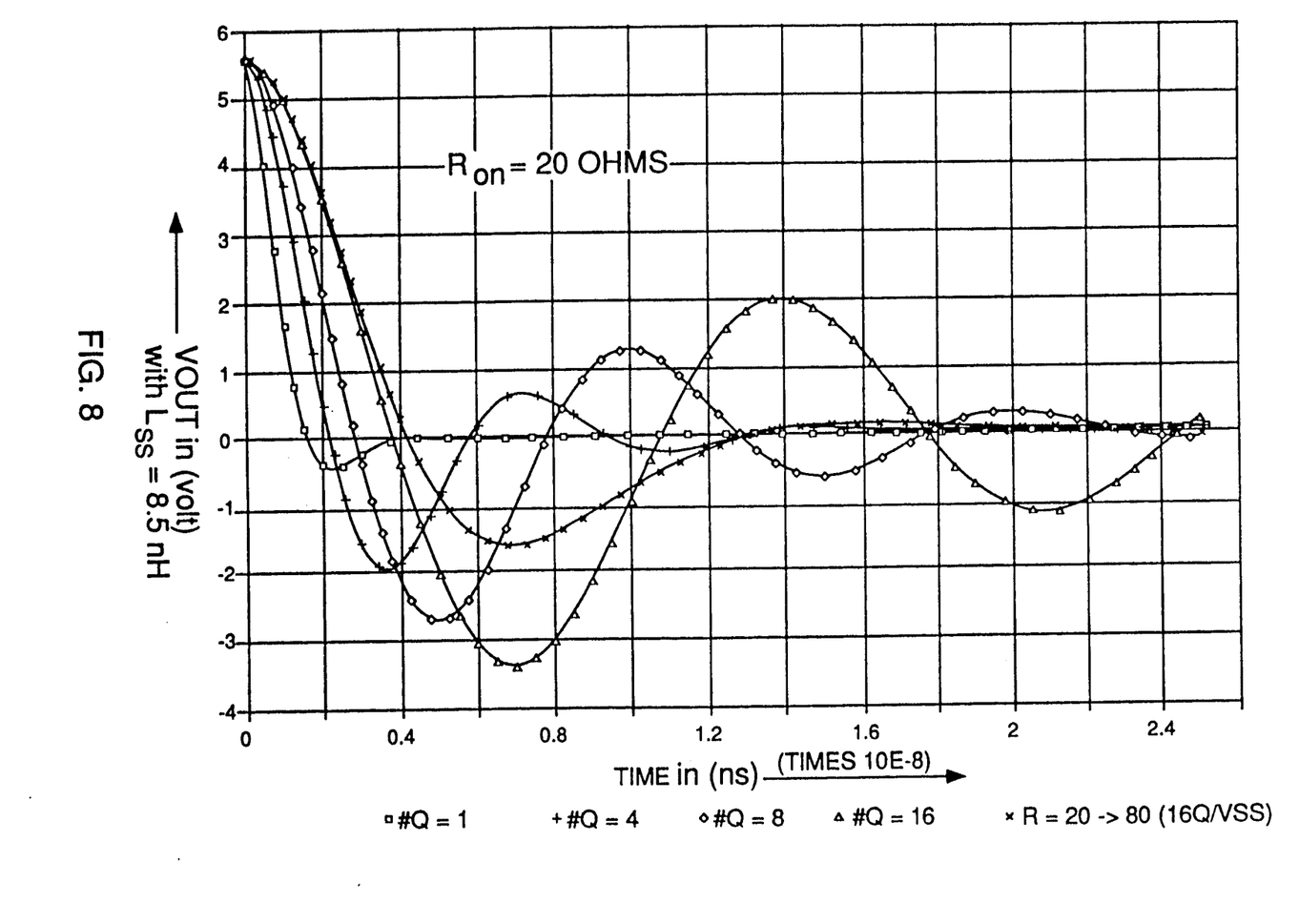
FIG. 8 is a series of graphs showing the effects of the present invention on circuit speed and noise for different numbers of outputs.

The effectiveness of the present invention in improving the response of an output buffer circuit is shown in the graphs of FIG. 8 which illustrate responses for different numbers Q of output devices, with the resistance R being varied by the circuitry in the manner described above. It will be seen from FIG. 8 that the responses of the circuitry of this invention are considerably better in terms of both noise and speed than those of the prior art circuitry represented by the curves of FIGS. 3a, 3b, 4a, 4b, 5a and 5b.

We claim:

1. Electrical output buffer circuitry for reducing noise in the output signal of said circuitry, comprising:
   a high input branch having a high signal input terminal associated therewith;
   a low input branch having a low signal input terminal associated therewith;
   said high input branch and said low input branch each having a variable resistance portion;
   signal output circuitry connected to said variable resistance portion of said high input branch and to said variable resistance portion of said low input branch;

means for turning on either said high branch or said low branch of said output buffer circuitry in response to a signal at said high or said low input terminal;

said turning on of said one of said branches decreasing the resistance thereof;

feedback means in each of said branches;

means connecting said feedback means in each of said branches to said variable resistance portion thereof; and means for enabling said feedback means a predetermined time after turning on one or the other of said branches;

whereby, after turning on of one of said branches and enabling of said feedback means, said feedback means in the turned on branch increases the resistance in said turned on branch to thereby decrease said noise in said output signal.

2. Buffer circuitry in accordance with claim 1 in which said buffer circuitry has a high resistance prior to being turned on, said buffer circuitry including:

means for decreasing the value of said resistance rapidly to a low level in a first time period after said turning on.

3. Buffer circuitry in accordance with claim 2 in which said resistance remains at said low level for a second period of time following said first time period.

4. Buffer circuitry in accordance with claim 3 including:

means for increasing the value of said resistance in a third time period following said second time period.

5. Buffer circuitry in accordance with claim 4 in which the value of said resistance remains at a relatively stable level during a portion of said third period.

6. Buffer circuitry in accordance with claim 5 in which the value of said resistance decreases after said relatively stable level at the end of said third time period.

7. Buffer circuitry in accordance with claim 6 in which the value of said resistance decreases to essentially said low level during a fourth time period.

8. Electrical output buffer circuitry for reducing noise in the output signal of said circuitry, comprising:

a high input branch having a high signal input terminal associated therewith;

a low input branch having a low signal input terminal associated therewith;

said high input branch and said low input branch each having a variable resistance portion;

signal output circuitry connected to said variable resistance portion of said high input branch and to said variable resistance portion of said low input branch;

means for turning on either said high branch or said low branch of said output buffer circuitry in response to a signal at said high or said low input terminal;

each of said variable resistance portions of said branches including a pair of transistors connected to said signal output circuitry;

said output buffer circuitry including means for turning on the pair of said transistors in the one of said branches which is turned on to decrease the resistance thereof and for turning off the pair of said transistors in the one of said branches which is not turned on;

feedback means in each of said branches;

means connecting said feedback means in each of said branches to said pair of transistors in that branch; and means for enabling said feedback means a predetermined time after turning on of said output buffer circuitry;

whereby, after turning on of one of said branches and enabling of said feedback means, said feedback means in the turned on branch turns off one of said transistors of said pair of transistors in said turned on branch to increase the resistance in said turned on branch and thereby decrease the noise in said output signal.

9. Buffer circuitry in accordance with claim 8 including means for disabling said feedback means a predetermined time after enabling of said feedback means to turn on said turned off one of said transistors to decrease the resistance in said turned on branch.

10. Buffer circuitry in accordance with claim 8 in which said pair of transistors in said high branch are P channel pull-up transistors and said transistors in said low branch are N channel pull-down transistors.

11. Buffer circuitry in accordance with claim 8 in which said feedback means includes a pair of pass-gate transistors.

12. Buffer circuitry in accordance with claim 11 in which said feedback means includes a NAND gate connected between said pass-gate transistors and the one transistor of said pair of transistor which is turned on and off.

* * * * *